(12) United States Patent
Nair

(10) Patent No.: US 7,772,875 B2
(45) Date of Patent: Aug. 10, 2010

(54) INPUT/OUTPUT CIRCUIT FOR EVALUATING DELAY

(75) Inventor: Mukesh Nair, Pune (IN)

(73) Assignee: NXP B.V., Eindhoven (NL)

( * ) Notice: Subject to any disclaimer, the term of this patent is extended or adjusted under 35 U.S.C. 154(b) by 38 days.

(21) Appl. No.: 12/158,121

(22) PCT Filed: Dec. 18, 2006

(86) PCT No.: PCT/IB2006/054919

§ 371 (c)(1),
(2), (4) Date: Jun. 19, 2008

(87) PCT Pub. No.: WO2007/072398

PCT Pub. Date: Jun. 28, 2007

(65) Prior Publication Data

US 2008/0272799 A1    Nov. 6, 2008

(30) Foreign Application Priority Data

Dec. 21, 2005    (EP) .................................. 05112655

(51) Int. Cl.
*H03K 19/003* (2006.01)
(52) U.S. Cl. ............................... 326/27; 326/31; 326/16
(58) Field of Classification Search .................... 326/16, 326/26–27, 31, 62, 80–81
See application file for complete search history.

(56) References Cited

U.S. PATENT DOCUMENTS

| 5,438,278 | A |   | 8/1995 | Wong et al. |
| 5,448,181 | A | * | 9/1995 | Chiang ........................ 326/27 |
| 5,661,414 | A | * | 8/1997 | Shigehara et al. ............. 326/81 |
| 6,236,237 | B1 | * | 5/2001 | Wong et al. ................... 326/83 |
| 6,366,126 | B1 | * | 4/2002 | Watarai ....................... 326/83 |
| 6,563,335 | B2 |   | 5/2003 | Seki |

OTHER PUBLICATIONS

Sanchez, Hector; et al "A Versatile 3.3/2.5/1.8-V CMOS I/O Driver Built in a 0.2-UM, 3.5-NM TOX, 1.8-V CMOS Technology" IEEE Journal of Solid-State Circuits, vol. 34, No. 11, Nov. 1999, pp. 1501-1511.

* cited by examiner

*Primary Examiner*—James Cho

(57) ABSTRACT

An electronic device comprising at least one input/output circuit (10) in a first supply voltage domain (VDD, GND) is provided. The electronic device furthermore comprises a buffer (INV) which is coupled to the input/output circuit for driving an input of the input/output circuit (10). The buffer comprises a first and second switch (T1, T2; T4, T5). The buffer is arranged in a second supply voltage domain (VDD1, GND1). Furthermore, a control circuit is coupled to the buffer for controlling the first and second switch (T1, T2; T4, T5) such that during a transition of an input signal of the input/output circuit (10) both switches (T1, T2; T4, T5) are temporarily kept in a conducting state and a crowbar current flows through the buffer (INV).

5 Claims, 12 Drawing Sheets

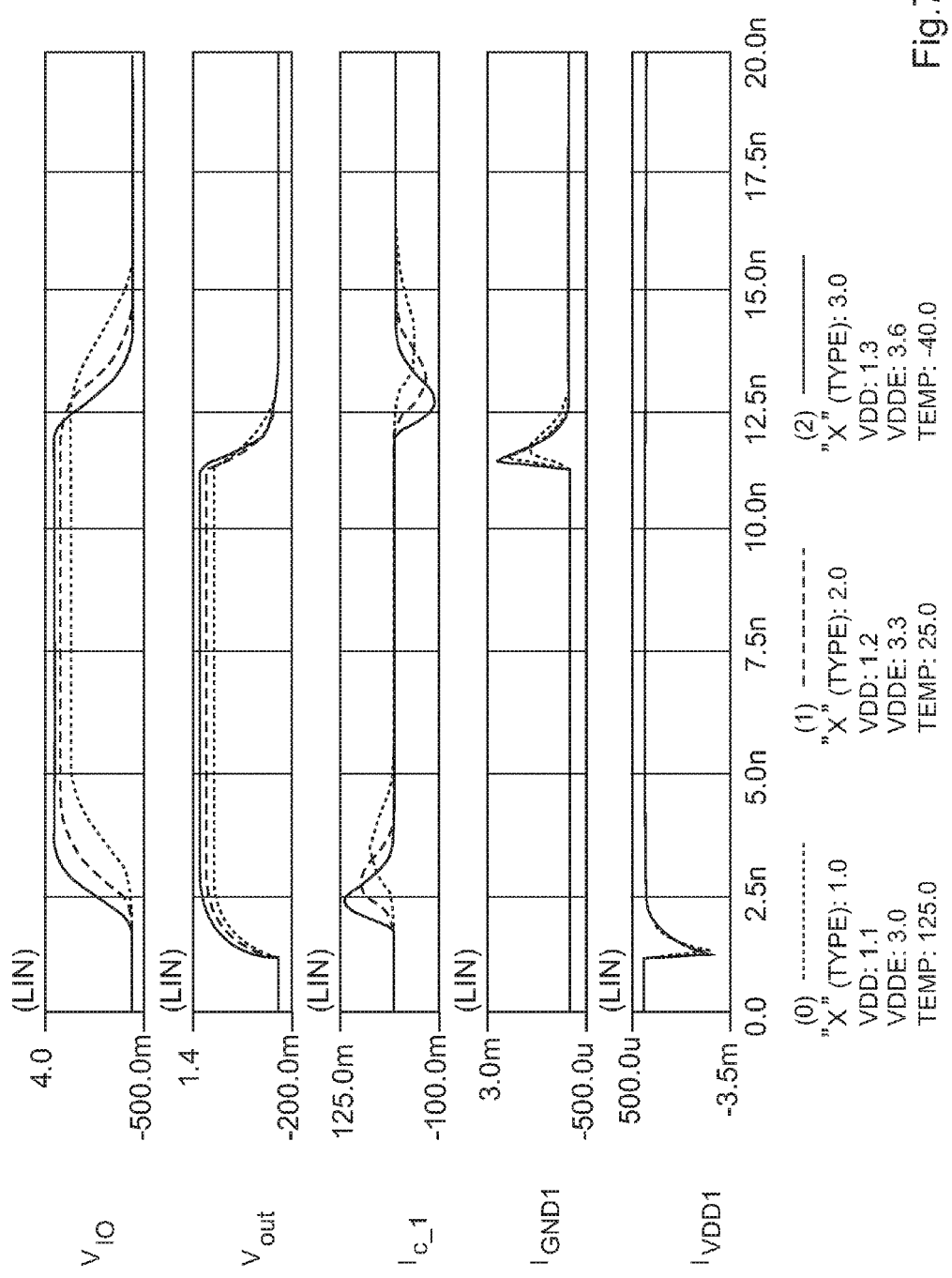

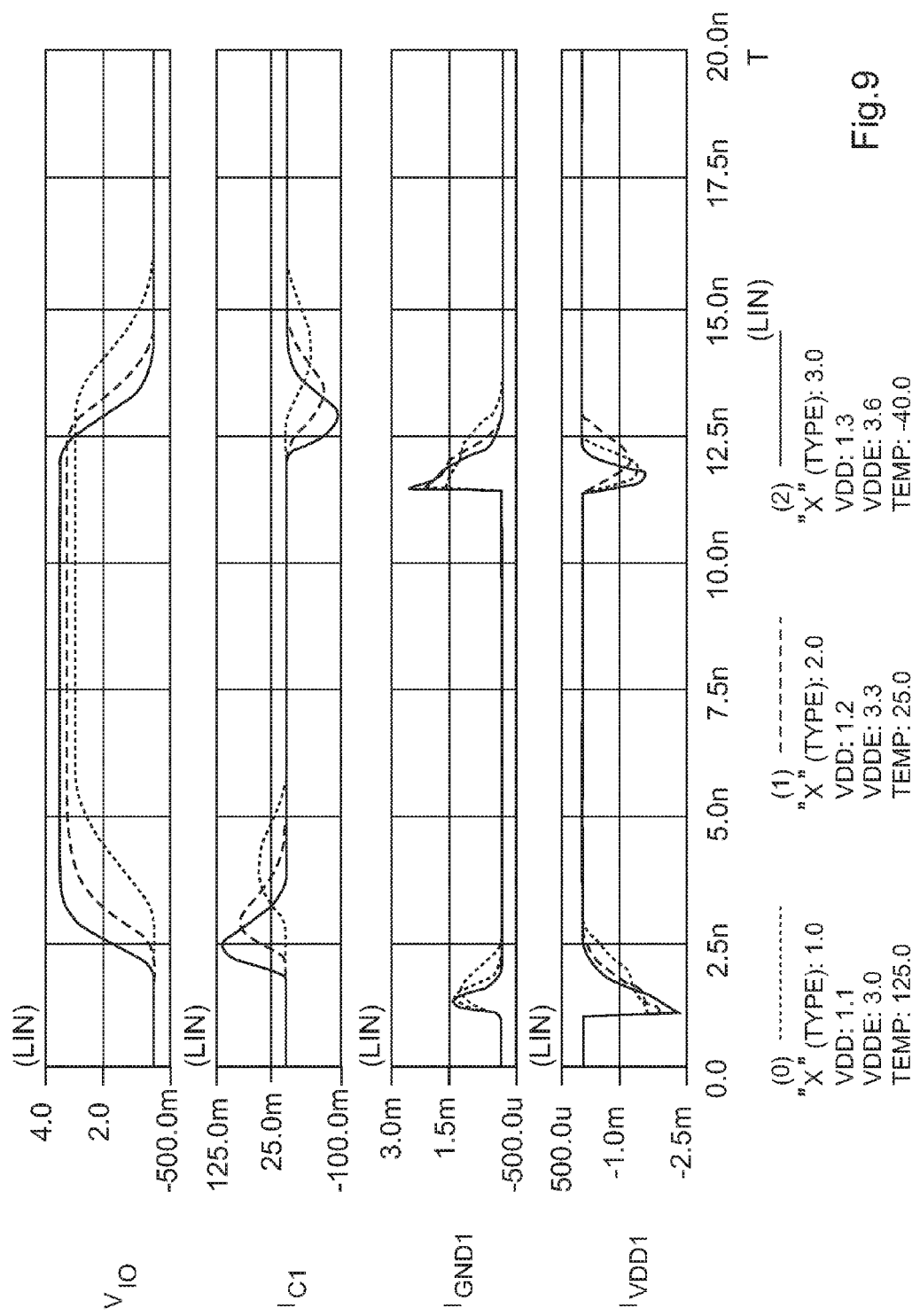

INPUT/OUTPUT CIRCUIT FOR EVALUATING DELAY

FIELD OF THE INVENTION

The invention relates to an electronic device with an input/output circuit and method for evaluating a delay of an input/output.

BACKGROUND OF THE INVENTION

To evaluate the performance of input/output I/O circuits within an integrated circuit, it is desirable to measure the delay between the input and the output of such a circuit. The delay of an I/O circuit is an important parameter as it affects the overall timing of the integrated circuit.

However, numerous difficulties are present to measure the delay of an I/O cell as it is usually not possible to access the input terminals of such an I/O circuit because these terminals are typically connected to a core side of the integrated circuit.

U.S. Pat. No. 6,563,335 B2 discloses a test method for semiconductor device to evaluate the delay of an input/output I/O circuit. A delay evaluation circuit is arranged in a basic cell area of the chip core portion. A test cell comprises a first delay circuit with several stages of inverters connected by an interconnect layer and a delay evaluation switching circuit. The test cell can be switched between a first measurement mode for measuring a delay between the input of the I/O circuit and the output I/O circuit and a second measurement mode for measuring a delay between the input and the output of the I/O circuit via a first delay circuit. However, according to this method, a test cell needs to be included on the semiconductor device consuming a significant amount of the chip area on the semiconductor chip.

SUMMARY OF THE INVENTION

It is an object of the invention to provide an electronic device with an input/output circuit within which a transition of input signals to the input/output circuit can be determined without the need to directly access the input terminals of the input/output circuit.

This object is solved by an electronic circuit according to claim 1 and a method for evaluating a delay of an input/output circuit according to claim 6.

Therefore an electronic device is provided. The device comprises an input/output circuit in a first supply voltage domain and a buffer driving the input of the input/output circuit. The buffer comprises a first and second switch. The buffer is arranged in a second supply voltage domain. A control circuit is coupled to the buffer for controlling the first and second switch of the inverter such that during the transition of the input signal of the I/O circuit both switches are temporarily kept in a conducting state and a crowbar current flows through the buffer. Accordingly, the switches are controlled such that a crowbar current is intentionally provided in order to obtain a signal which is significantly higher such that it can be easily measured. The detected occurrence of the crowbar current may be used to determine the delay of an input/output circuit.

According to an aspect of the invention, the electronic device further comprises a measuring circuit which is coupled to the buffer. The measuring circuit measures the current in the second supply voltage domain and thus the crowbar current flowing through the buffer which will only occur when both switches in the buffer are simultaneously in a conducting state. This situation will correspond to approximately 50% of the transition of the input signal driving the input of the input/output circuit either high or low. As the mid point of the transition is determined at the input of the input/output circuit, this may be used to determine the delay of the input/output circuit.

According to an aspect of the invention, the buffer comprises a first and second resistor coupled between the first and second switch. The first and second resistor serves to control the current flowing through the buffer and linearize the output of the buffer. The output current of the buffer for driving the input terminal of the input/output circuit is determined according to the values of the first and second resistor such that the value of the driving signal for the input/output circuit can be set by selecting the first and second resistor.

According to a further aspect of the invention, a capacitance is coupled to the output of the buffer. The capacitance serves to determine an input slew of an input signal applied to the input/output circuit.

According to a preferred aspect of the invention, a second measuring circuit is coupled to the output of the input/output circuit to measure the output signals of the input/output circuit. The input/output delay of the input/output circuit is determined according to the measurements of the first and second measurement circuit. Accordingly, the delay of the input/output circuit can be determined without having to access the actual input terminal of the input/output circuit.

The invention also relates to a method for evaluating the delay of an input/output circuit within an electronic device. The input/output circuit is arranged in a first supply voltage domain. An input of the input/output circuit is driven by a buffer which is coupled to the input/output circuit and comprises a first and second switch. The buffer is arranged in a second supply voltage domain. The first and second switch are controlled such that during a transition of an input signal of the input/output circuit both switches are temporarily kept in a conducting state and a crowbar current flows through the buffer.

According to the invention, the currents that are drawn by circuits connected to the input and output stages of an I/O circuit are measured and the delay of the I/O circuit is calculated accordingly instead of measuring the delays related to the voltages at the input and the output of this I/O circuit. This may be performed by increasing the current in the input of the I/O circuit momentarily approximately at the mid point of the transition from high to low or from low to high in order to detect the mid point of the input transition. This may be performed by a combination of load and short circuit currents, which flow through the device during the switching thereof.

BRIEF DESCRIPTION OF THE DRAWINGS

The embodiments and advantages of the invention will now be described with reference to the Figures.

FIG. 7 shows a diagram of the timings of voltages and current timings for a circuit according to FIG. 5 with an additional supply and pin inductance.

FIG. 9 shows a graph of the timings of the voltage and current measurements for the circuit according to FIG. 8.

DESCRIPTION OF EMBODIMENTS

Figure 1:
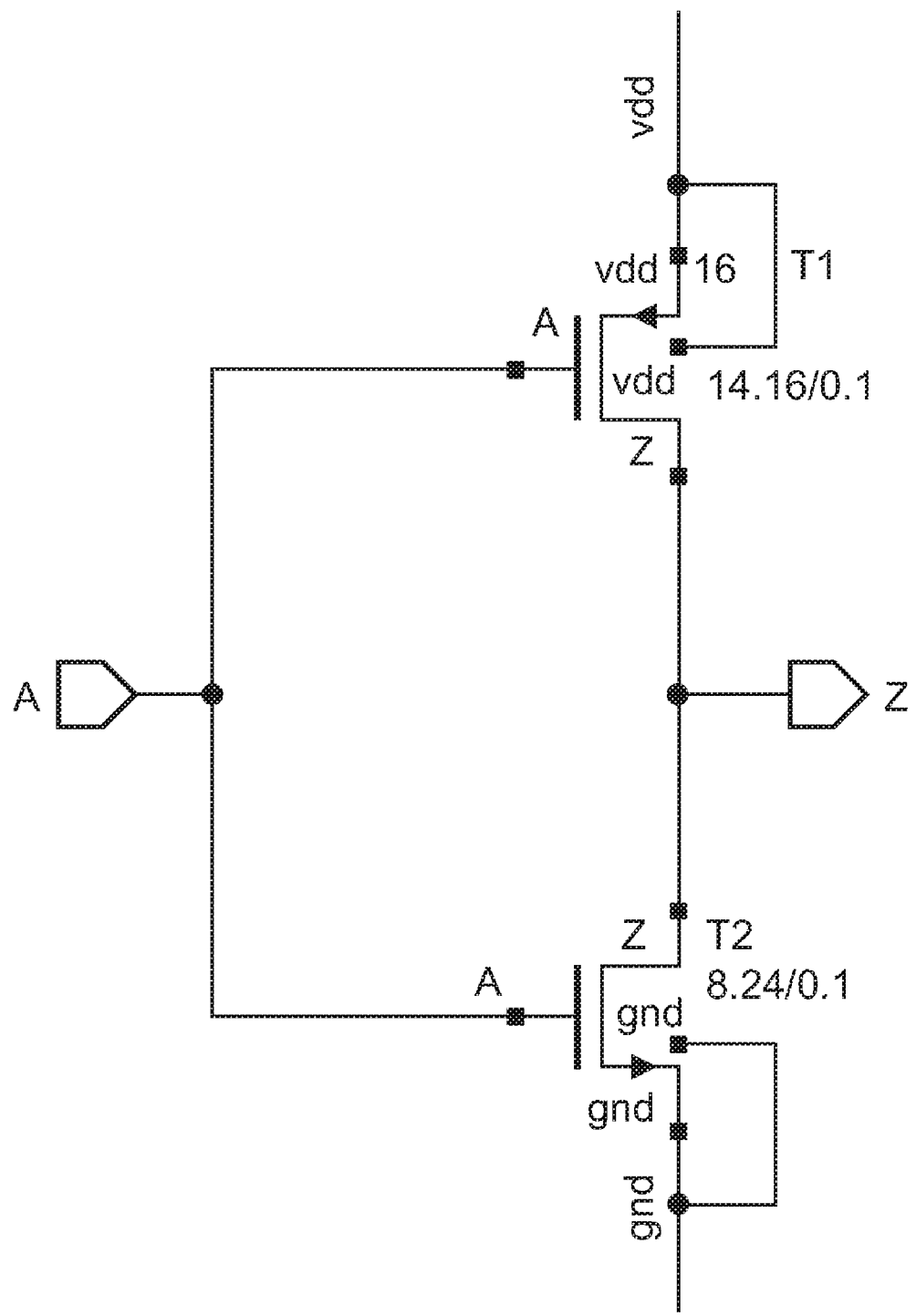
FIG. 1 shows a circuit diagram of a CMOS inverter.

FIG. 1 shows a circuit diagram of a CMOS inverter. The inverter comprises a first and second transistor T1, T2. The gates of these two transistors T1, T2 are coupled together. When such an inverter is switched, the current will have two components that are drawn from the supply $V_{DD}$. The first current component serves to charge the load capacitor and may be referred to as load current. The second current component is the short circuit current which flows from the terminal of the supply voltage to the ground terminal, i.e. the crowbar current. This current is at a maximum when the output swing is at the middle of the supply voltage because at this point, the PMOS as well as the NMOS transistors of the inverter have the maximum drain source voltage $V_{DS}$ during the transition such that both switches are conducting resulting in the crowbar current. In such a situation, the overall current will be composed of the load current and the crowbar current.

Figure 2:
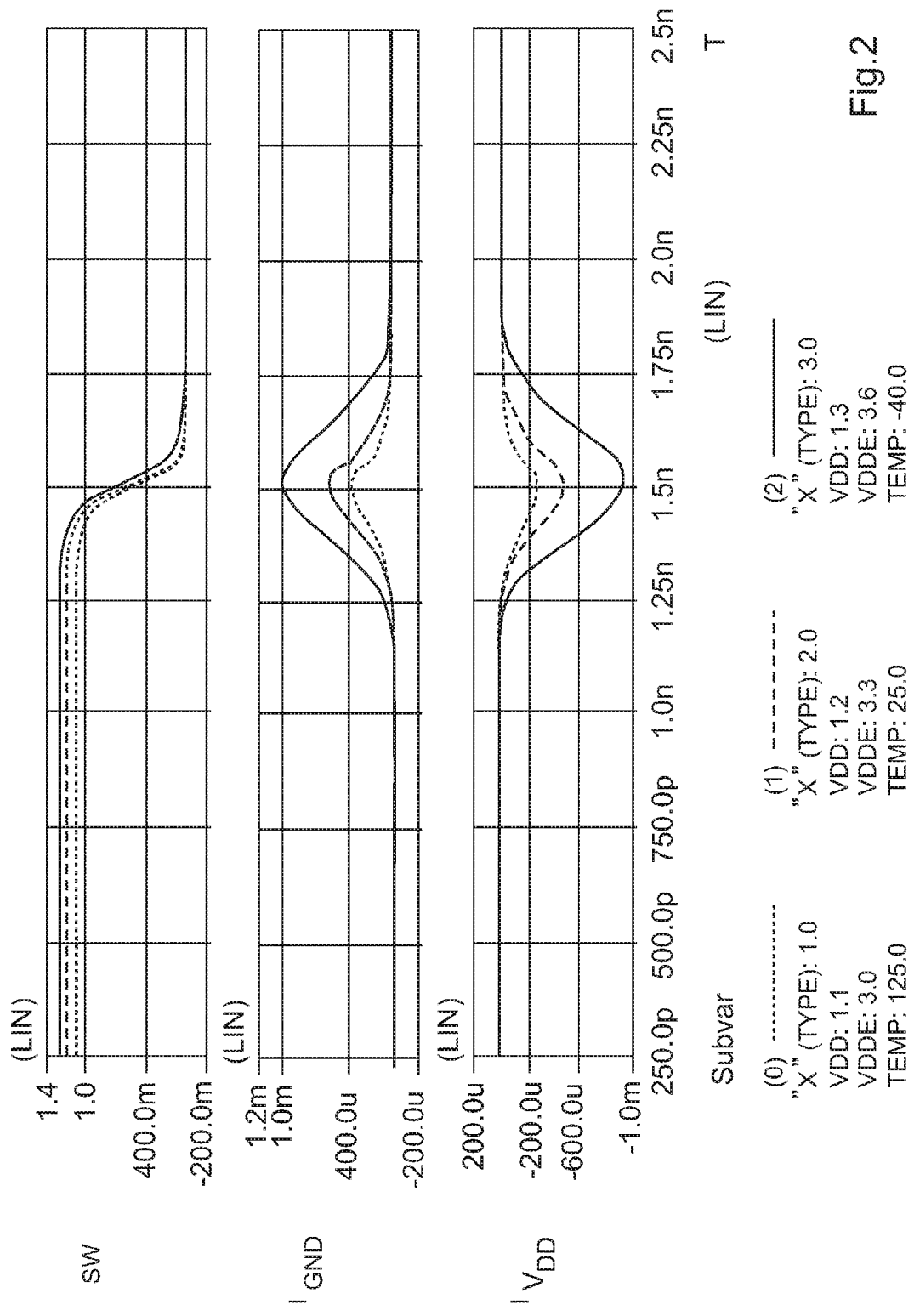
FIG. 2 shows a graph of a simulation of the switching of the inverter according to FIG. 1 without load condition.

FIG. 2 shows a graph of a simulation of the switching of the inverter according to FIG. 1 without load condition. In particular, the switching waveform SW, the current $I_{VDD}$ on the supply voltage path and the ground path $I_{GND}$ are shown. The peaks of the currents $I_{VDD}$ of the supply voltage path occur substantially aligned with the center of the switching waveform SW shown at the top of the graph of FIG. 2. Accordingly, by measuring the peak current, the center of the switching waveform may be determined.

Figure 3:
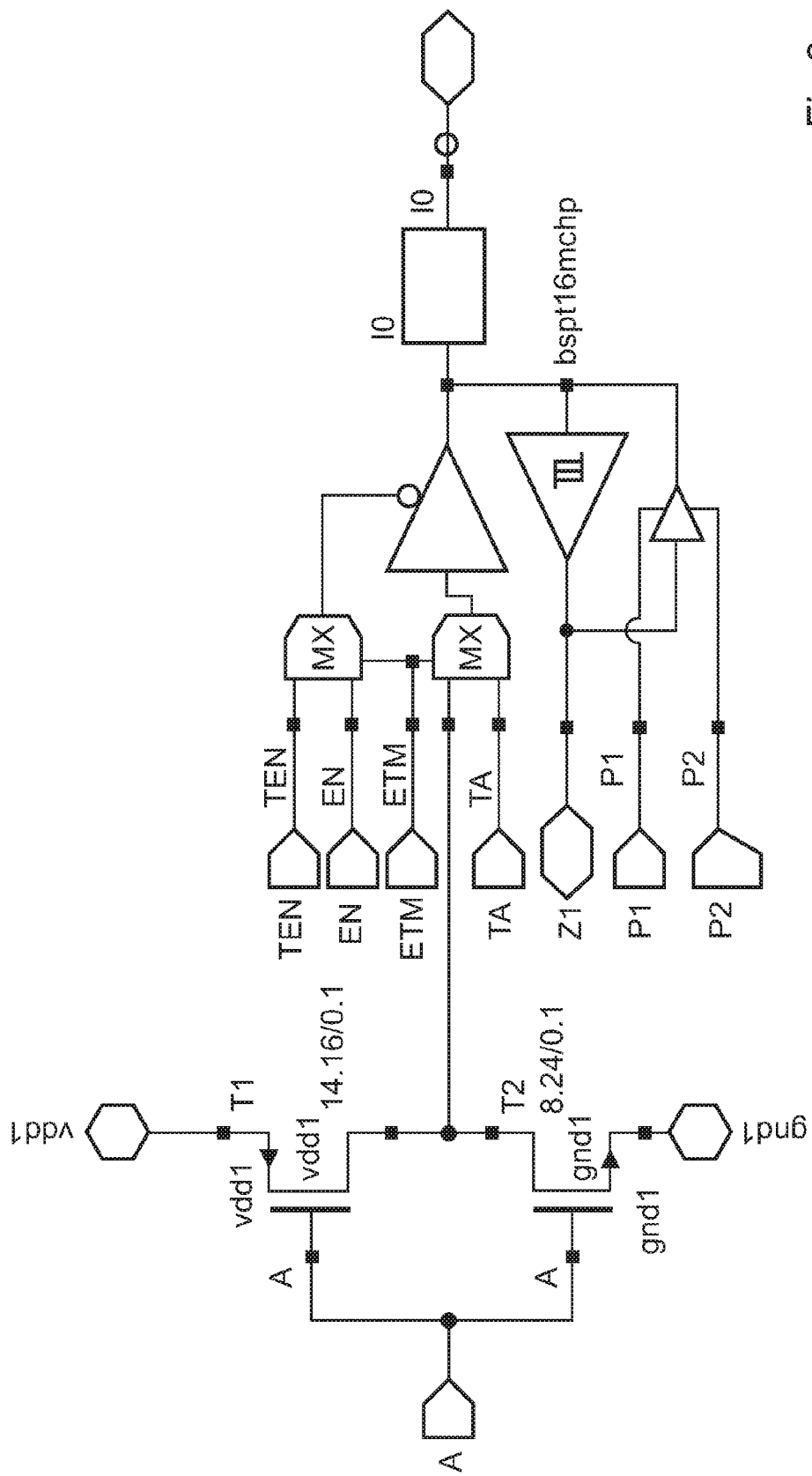
FIG. 3 shows a circuit diagram of an inverter driving an I/O cell.

FIG. 3 shows a circuit diagram of an inverter driving an I/O cell IO. The inverter of FIG. 3 corresponds to the inverter according to FIG. 1, wherein the supply voltage of the inverter is a supply voltage VDD1/GND1. The input slew of the input/output is chosen as 0.2 ns. A load of 30 pF is provided at the output of the I/O cell.

Figure 4:
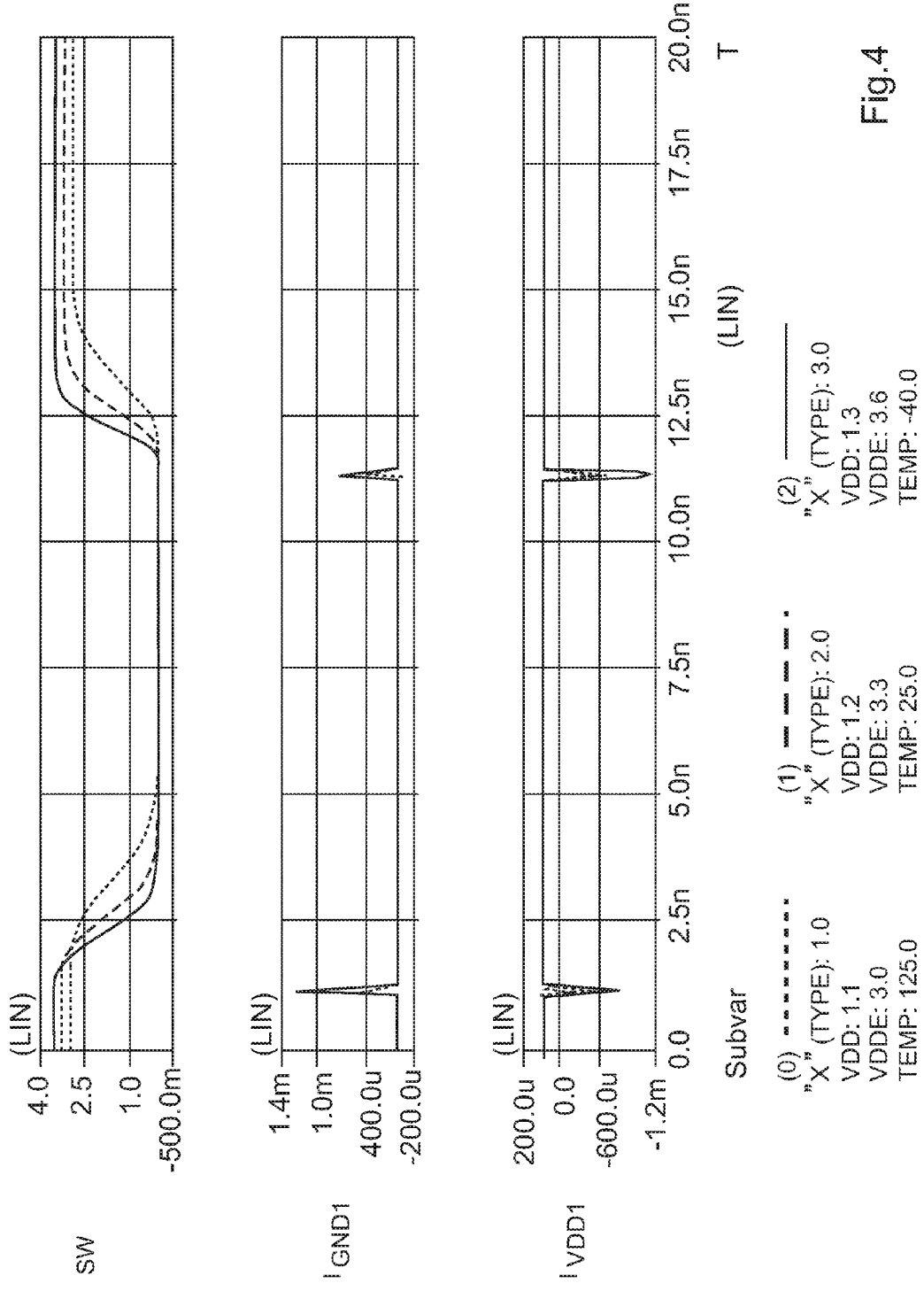
FIG. 4 shows a graph of the timings of the voltage and current measurement of the circuit according to FIG. 3.

FIG. 4 shows a graph of the timings of the voltage and current measurement of the circuit according to FIG. 3. The first graph shows the switching waveform SW at the output of the IO. The next graph shows the timing diagram of the current in the first ground path GND1 and the third graph shows the timing diagram of the current in the separate supply voltage path VDD1. Accordingly, the current pulse of the path of the supply voltage VDD1 is only of a short duration and comprises a very low amplitude, i.e. such a current pulse will be difficult to detect or to measure.

Figure 5:
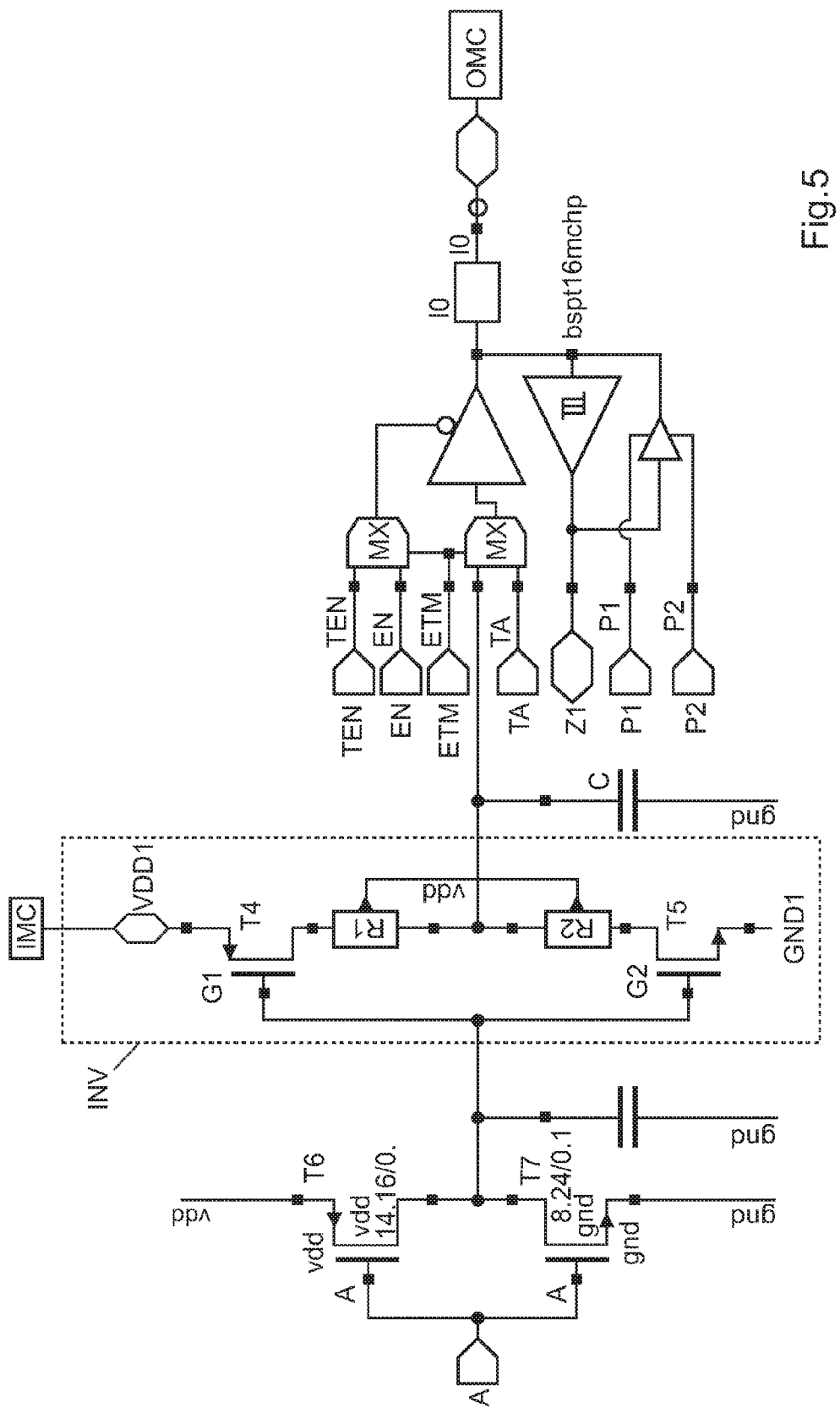
FIG. 5 shows a circuit diagram of the inverter INV and the I/O circuit with an additional loading stage.

FIG. 5 shows a circuit diagram of an inverter and an I/O circuit with an additional loading stage. The input/output circuit according to FIG. 5 corresponds to the input/output I/O circuit of FIG. 3. The inverter INV comprises a first and second transistor T4, T5 with their gates G1, G2 being coupled together. The inverter INV furthermore comprises a first and second resistor R1, R2 coupled between the first and second transistor T4, T5.

According to the first embodiment, the crowbar current, i.e. the short circuit current occurring when both of the switches T4, T5 of the inverter are conducting, is increased intentionally to be able to detect the midpoint of the input swing. This can be obtained according to the first embodiment by the provision of an additional load capacitor C, which is coupled between the output of the inverter INV and ground GND. It should be noted that the current drawn by any other small circuitry connected to the supply of the I/O circuit is dominated by the I/O driver current during switching. It should further be noted that this statement is only correct for the output section but not for the input section as the input section is connected to the supply domain of the chip core such that currents will be drawn in the supply domain of the chip core. Accordingly, difficulties arise to measure the currents drawn by the input stage of the I/O circuit when it is switching. However, these measurements are required to determine the delay of the I/O circuit IO.

As already mentioned according to FIG. 3, the inverter INV is coupled to a separate supply voltage VDD1 and to ground GND1. This separate supply voltage VDD1 serves to only supply the INV cell such that a current in such a domain can be measured separately to determine the mid point of the input transition. As the separate supply voltage domain is easily accessible, by monitoring this separate supply voltage domain, a conclusion can be made regarding the signals at the input stage of the input/output circuit IO. Accordingly, an input measuring circuit IMC can be coupled to the separate supply voltage domain VDD1 in order to detect the current flowing in the separate supply voltage domain VDD1 which will correspond substantially to the crowbar current flowing through the inverter.

At the output of the input/output circuit IO, an output measuring circuit OMC can be provided for determining and/or measuring the output current of the input/output circuit IO.

As mentioned above, in FIG. 5 an inverter INV is shown which drives the output of a bi-directional I/O cell. The output of the inverter INV is coupled to a capacitor C. Thus, during nominal operating conditions, an input slew of 850 ps is provided to the input of the I/O cell. This inverter INV is connected to a separate supply voltage VDD1 and a separate ground connection GND1. The purpose of such a separate supply voltage is the desire to measure the peak current of this supply in order to determine a mid point of an input swing. The inverter INV comprises two resistors R1, R2 for controlling the current and the duration of the current pulse. As an example, a load C of 30 pF is used at the output of the I/O cell. The load and the two resistors R1, R2 are chosen such that a peak current in the VDD1 and GND1 domain is achieved preferably at about 2 mA and with a pulse duration of more than 1 ns even in a worst case PVT condition.

Figure 6:
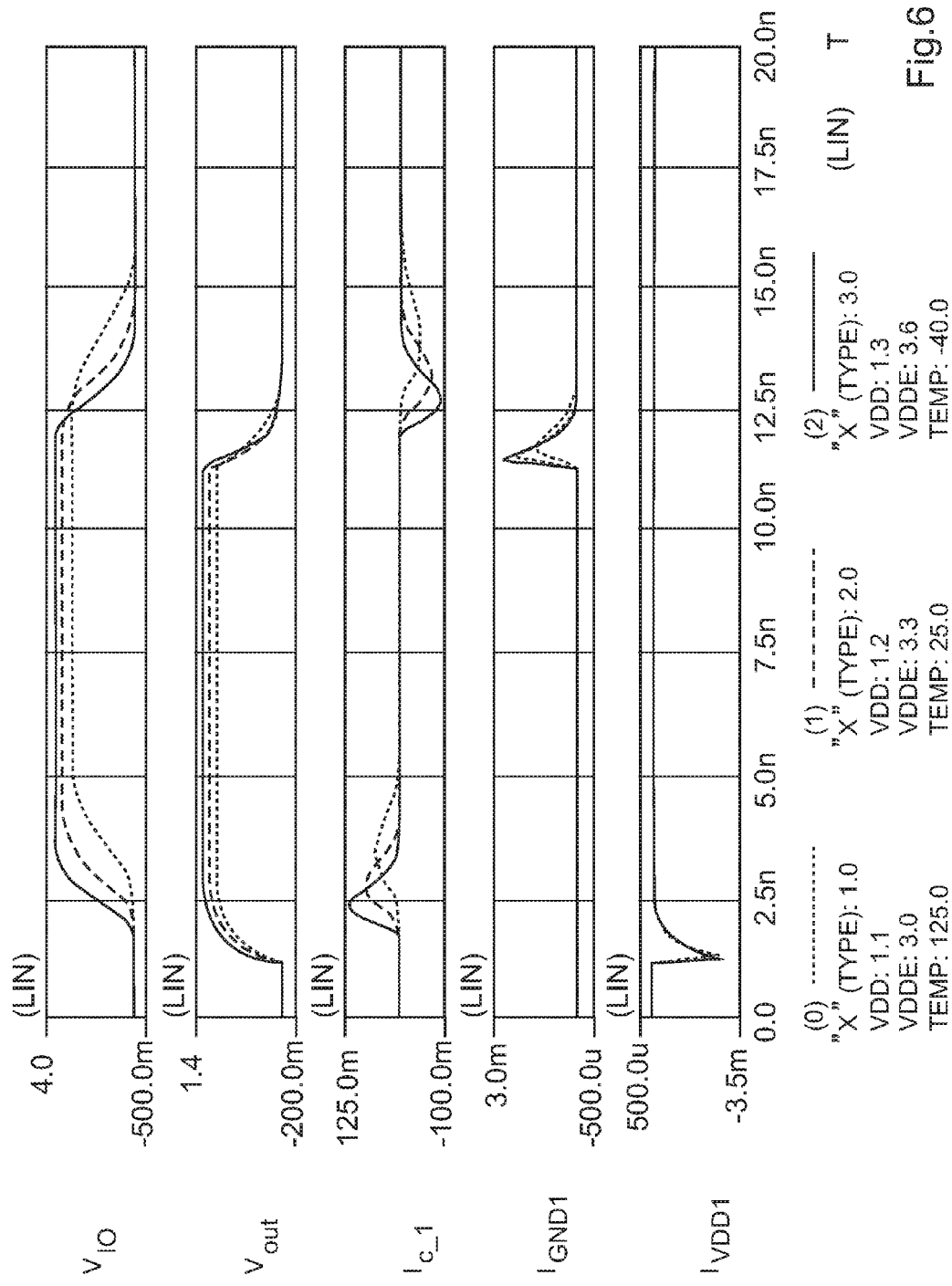
FIG. 6 shows a graph of the timings of voltage and current measurements for the circuit according to FIG. 5.

FIG. 6 shows a graph of the timings of voltage and current measurements for the circuit according to FIG. 5. The first graph relates to the voltage measurements $V_{IO}$ at the output of the I/O device. The second graph shows the voltage at the output node OUT of the inverter INV, i.e. the input voltage of the I/O circuit. The next diagram shows the current in the load connected to the output of the I/O circuit. Furthermore, the current in the ground path GND1 $I_{GND1}$ and the current in the voltage supply path $I_{VDD1}$ is also depicted. Accordingly, the delay of the I/O cell may be determined according to the conventional voltage method as well as according to the current measurement according to the invention.

Table 1 discloses parameters regarding the delay measurement according to the conventional voltage method and according to the current measurement method according to the invention.

| Parameter | Condition | Slow PVT | Nominal PVT | Fast PVT | Units |
|---|---|---|---|---|---|
| Rise delay convention method | Input to IO 50% vdd1 to output of IO 50% of vdde3v3 | 2.09 | 1.41 | 1.01 | ns |
| Fall delay convention method | Input to IO 50% vdd1 to output of IO 50% of vdde3v3 | 2.26 | 1.55 | 1.18 | ns |
| Rise delay according to the invention | Absolute Input current in VDD1 peak to absolute output peak current in load | 2.03 | 1.35 | 1.12 | ns |
| Fall delay according to the invention | Absolute Input current in GND1 peak to absolute output peak current in load | 2.35 | 1.66 | 1.20 | ns |

Accordingly, the results of the conventional voltage method and the current measurement method according to the invention are quite close and correspond substantially to each other.

In Table 2, the effect of a supply bounce on the conventional voltage method and the current measurement method according to the invention are shown. An inductance of 5 nH is introduced at the I/O supply. The same applies to the separate supply voltage VDD1 and GND1.

| Parameter | Condition | Slow PVT | Nominal PVT | Fast PVT | Units |
|---|---|---|---|---|---|
| Rise delay convention method | Input to IO 50% vdd1 to output of IO 50% of vdde3v3 | 2.09 | 1.41 | 1.01 | ns |
| Fall delay convention method | Input to IO 50% vdd1 to output of IO 50% of vdde3v3 | 2.26 | 1.55 | 1.18 | ns |
| Rise delay according to the invention | Absolute Input current in VDD1 peak to absolute output peak current in load | 1.99 | 1.37 | 1.12 | ns |
| Fall delay according to the invention | Absolute Input current in GND1 peak to absolute output peak current in load | 2.32 | 1.66 | 1.23 | ns |

FIG. 7 shows a diagram of voltages and current timings for a circuit according to FIG. 5 with an additional inductance. As in FIG. 6 the output voltage of the I/O circuit, namely $V_{IO}$ and the input voltage of the I/O circuit $V_{OUT}$ are depicted.

Figure 8A:
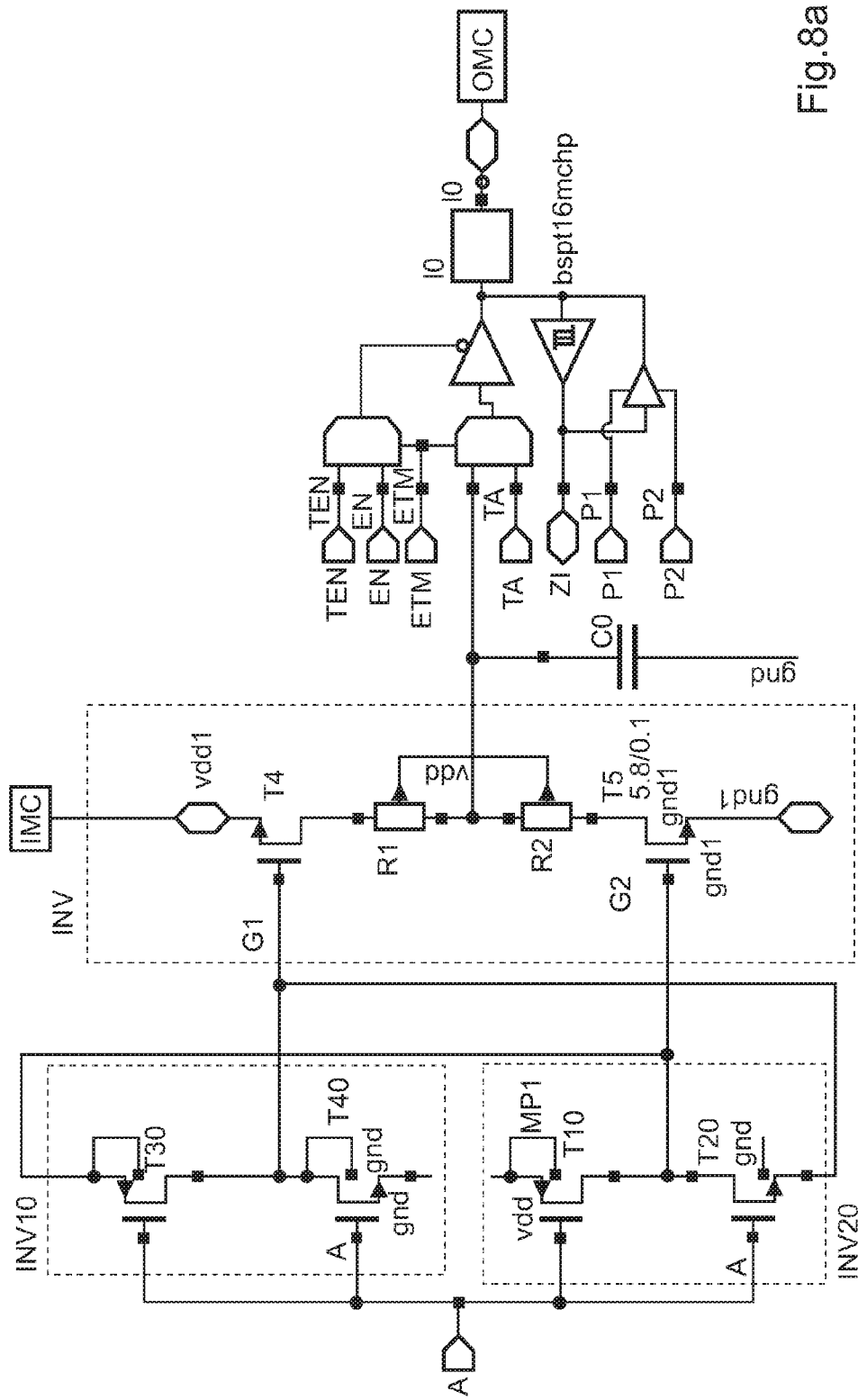
FIG. 8a shows a circuit diagram of a driving circuit and an I/O cell according to a second embodiment of the invention.

FIG. 8a shows a circuit diagram of a driving circuit and an I/O cell according to a second embodiment of the invention. The I/O circuit according to FIG. 8a corresponds to the I/O circuit according to FIG. 5. An inverter INV is coupled to the input of the I/O circuit. As in the circuit diagram of FIG. 5, a load capacitor C is coupled to the output of the inverter INV. This capacitor C serves to obtain an output slew 1 ns in nominal conditions. As in the circuit diagram of FIG. 5, the second inverter INV2 is coupled to a separate voltage supply VDD1, GND1. The provision of the separate voltage supply serves to measure the peak current in this supply in order to determine the mid point of the input swing. The resistors R1, R2 are used to control the current and to linearize the output. A load of 30 pF is coupled to the output of the I/O cell. The FIG. 8a also has an extra circuit INV10, INV20 which drives the INV which is explained separately in FIG. 8b.

Figure 8B:
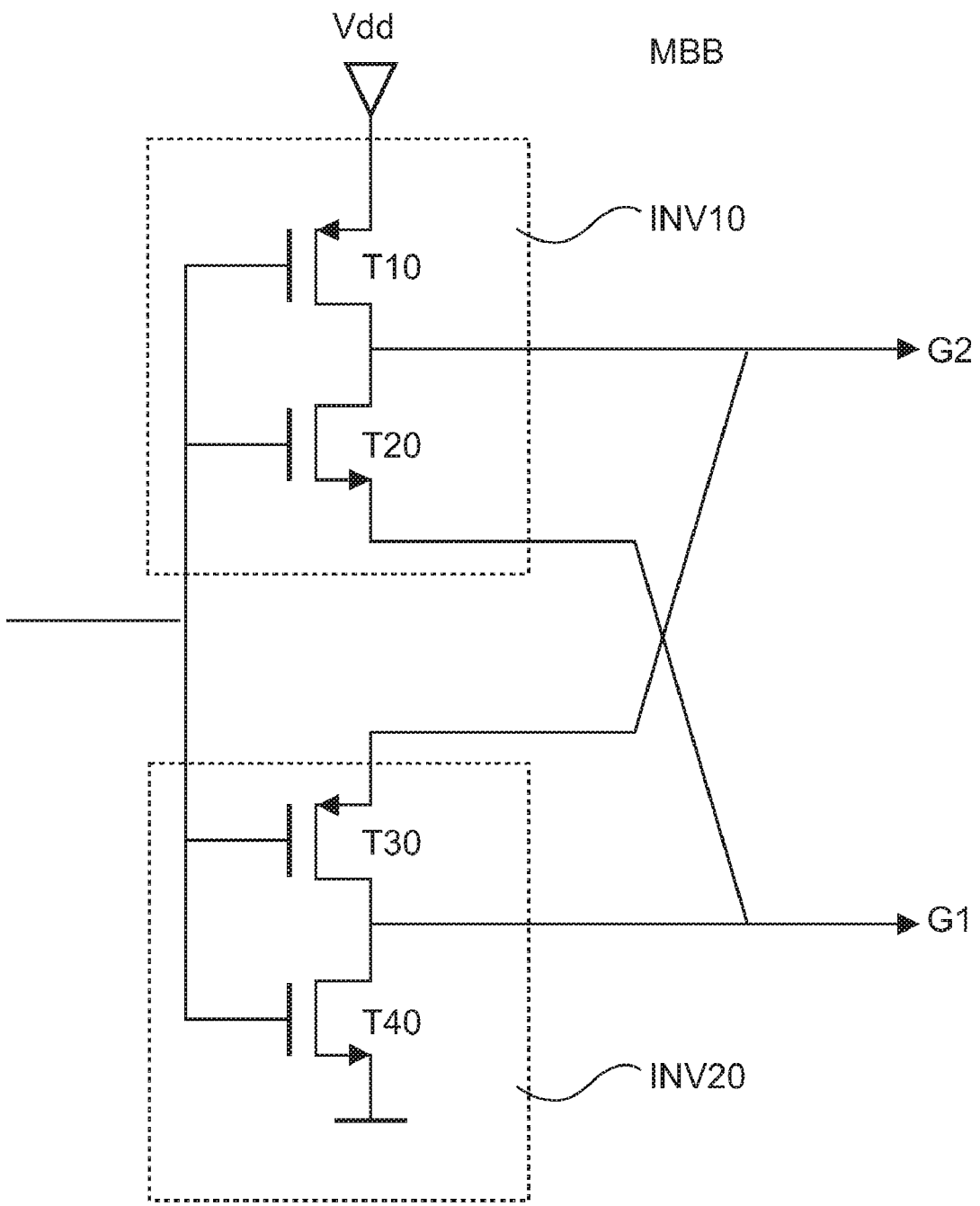
FIG. 8b shows a circuit diagram of a make before brake circuit MBB.

FIG. 8b shows a circuit diagram of a make before brake circuit MBB which can be connected to the first and second gate G1, G2 of the inverter INV. The make before brake circuit MBB serves to control the inverter INV, i.e. the buffer to switch the first and second transistor T4, T5 temporarily both simultaneously into a conducting state for a predetermined time period during the transition of the input signal of the I/O cell. The make before brake circuit MBB comprises a first and second inverter INV10, INV20. The output of the first inverter INV10 replaces one of the power supply lines of the second inverter INV20. The output of the second inverter INV10 replaces one of the power supply lines of the first inverter INV10. The make before brake circuit MBB controls the first and second transistor T4, T5 of the inverter INV such that one of the transistors only then goes to a non-conducting state only after the other transistors has already assumed a conducting state. Accordingly, for a time period (determinable by the make before brake circuit MBB) both transistors are in a conducting state and a crowbar current is intentionally created.

FIG. 9 shows a graph of timing diagrams for the circuit according to FIG. 8. Here the output voltage of the I/O circuit, the current in the load connected to the cell $I_{C\_1}$ as well as the current through the ground path GND1 $I_{GND1}$ and the current $I_{VDD1}$ path VDD1 is depicted. Measurements according to FIG. 9 relate to the short circuit current but not to the total current drawn from the supply. Accordingly, during the rise delay measurement, the peak current in the GND1 path is taken into account, during the fall delay measurement, the peak current in the VND1 path is taken into account.

Table 3 shows the results of the measurements according to the conventional voltage method and the current measurement method according to the invention.

| Parameter | Condition | Slow PVT | Nominal PVT | Fast PVT | Units |
|---|---|---|---|---|---|
| Rise delay convention method | Input to IO 50% vdd1 to output of IO 50% of vdde3v3 | 2.15 | 1.43 | 1.02 | ns |
| Fall delay convention method | Input to IO 50% vdd1 to output of IO 50% of vdde3v3 | 2.25 | 1.59 | 1.22 | ns |
| Rise delay according to the invention | Absolute Input current in GND1 peak to absolute output peak current in load | 2.34 | 1.44 | 1.07 | ns |
| Fall delay according to the invention | Absolute Input current in VDD1 peak to absolute output peak current in load | 2.30 | 1.52 | 1.15 | ns |

Now, a further inductance is introduced into the I/O supply and into the VDD1 supply. Inductance may have a value of 5 nH.

Figure 10:
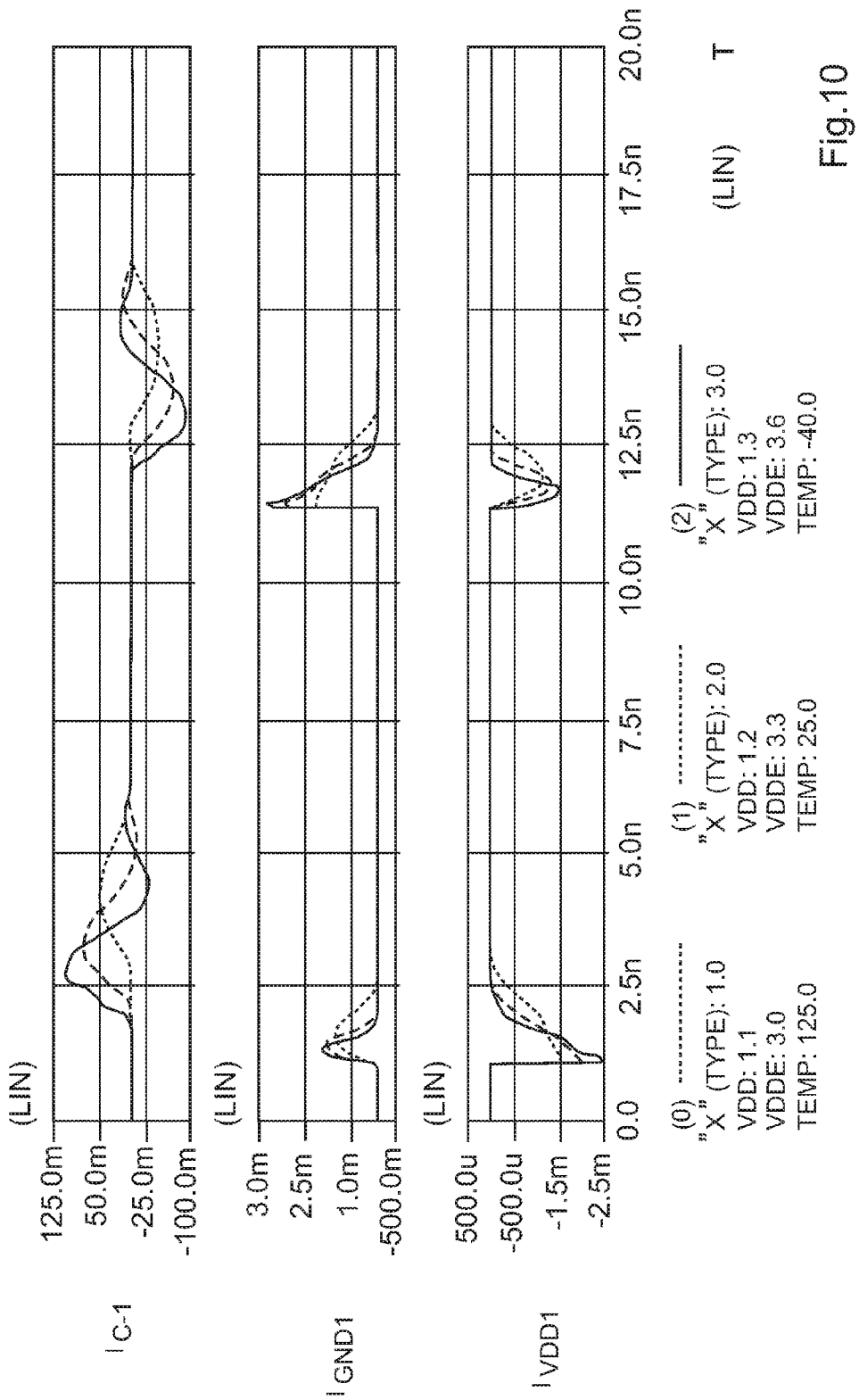
FIG. 10 shows a graph of the timings of the currents in a circuit according to FIG. 8 with an additional inductance.

FIG. 10 shows a graph of the timings of the currents in a circuit according to FIG. 8 with an additional inductance. As can be seen from the graph of FIG. 10, the width of the current pulse can be controlled by adjusting the switching timings.

Accordingly, current probes may be used which work at a lower sensitivity for determining the currents flowing through VDD1 and GND1 path.

Figure 11:
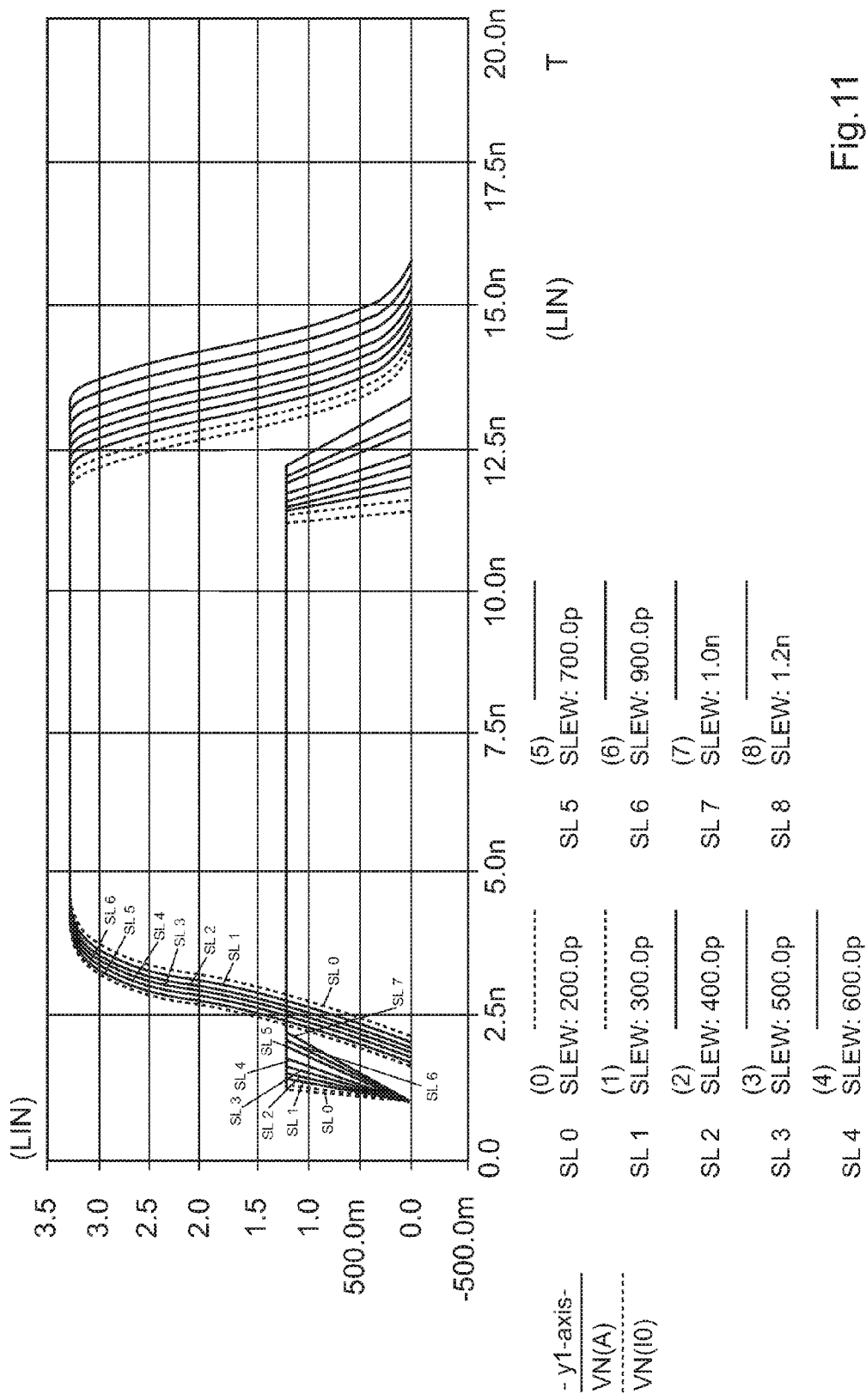
FIG. 11 shows a graph of the input and output of the I/O cell for different input slew.

FIG. 11 shows a graph of the input slew of the I/O cell. Here, nine different slews SL0-SL8 are depicted. The input slew applied to the I/O cell can be adjusted by varying the capacitance applied thereto. The slews SL0-SL8 vary from 0.2 ns to 1.2 ns. In the graph of FIG. 11, the effect of the different slews on the delay of the I/O circuit are measured. This can be performed to verify that the methodology proposed is not sensitive to the input slew value.

Table 5 shows the parameters associated to the different input slews. From the table 5 as well as from the graph of FIG. 11, it can be seen that the delay of the I/O cell does not vary significantly for different input slews.

| Input Slew | Rise delay | Fall delay | Units |
|---|---|---|---|
| 0.2 | 1.35 | 1.51 | ns |
| 0.3 | 1.36 | 1.52 | ns |
| 0.4 | 1.37 | 1.53 | ns |
| 0.5 | 1.38 | 1.53 | ns |
| 0.6 | 1.38 | 1.53 | ns |
| 0.7 | 1.39 | 1.54 | ns |
| 0.9 | 1.41 | 1.55 | ns |
| 1.0 | 1.41 | 1.55 | ns |
| 1.2 | 1.42 | 1.55 | ns |

For example, a digital oscilloscope with a high bandwidth as well as high speed current probes with good sensitivity may be used to measure the difference in the peak currents in the VDD and in the I/O circuits in order to directly determine the delay of the I/O circuit.

According to the invention, the delay of an I/O circuit is measured using the measurements of the current peaks. This can be performed with a reasonable accuracy. The peak current within a CMOS circuit which occurs at the center of the transient switching waveform is used to determine the mid point of such a switching on the core side of the I/O circuits. The peak current measurement technique according to the invention is advantageous, as the laws of physics indicate that the speed of electrons in a conductor is very close to the speed of light. This the distance at which we measure the current in a small system where the electrical length may not differ more than a few inches should not add to any inaccuracy in the delay values. Thus we can measure the current in the VDD domain and the I/O domain at two different points and still have similar results. This may be another advantage of measuring current instead of voltage, which has inherent dependency on the measurement set-up.

In order to perform the current measurements according to the invention, a separate voltage supply and ground conditions are required for an inverter stage, which is feeding into the input circuit connected to the I/O circuit. The current peak measurement according to the invention may be used in a scan chain wherein the inverter can be the final part feeding into the I/O circuit. Such a technique may be part of the I/O cell which provides a scan mux inside the I/O cell. As mentioned above, a separate VDD and GND rail needs to be incorporated in such an I/O ring.

The above described delay measurements require that the time, when the input signal to the I/O buffer has reached 50% in transition time needs to be determined in order to evaluate the delay of the I/O cell. This time may be obtained by measuring the time at which the current peaks on the VDD1 supply is fed to the inverter INV. As the current fed to this cell is externally accessible as the supply VDD1 is fed from the outside of the chip. The delay can be determined by measuring the time difference between the current peak in the VDD1 domain and the current peak of the I/O supply. Alternately the delay can be determined by measuring the time difference between the current peak in the VDD1 domain and the time at which IO reached 50% of I/O supply voltage as this signal is accessible externally.

Within typical CMOS circuits, the period during which the NMOS and the PMOS transistors within an inverter are conducting at the same time is minimized in order to restrict the crowbar current. This can also be performed for an I/O circuit, where it is called brake before make. However, according to the invention, a higher crowbar current is required to measure the current peaks in order to determine the delay of an I/O circuit. Therefore, a higher crowbar is intentionally provided to obtain a current within measurable limits. Such a circuit may be referred to as a make before brake circuit. This is restricted only to the input circuitry of the I/O cell and not to the drivers.

The invention also relates to an electronic device with an input/output circuit within a first supply voltage domain. The electronic device furthermore comprises a driving circuit coupled to the input/output circuit for driving the input of the input/output circuit. The buffer typically comprises a first and second switch. The buffer is arranged in a second supply voltage domain. A control circuit is furthermore provided which is coupled to the buffer, for controlling the first and second switch such that during a transition of an input signal of the input/output circuit both switches are temporarily kept in a conducting state and a crowbar current flows through the driving circuit.

The above described current peak measurement methods according to the invention may be used in any chip testing equipment. The above described current peak measurement technique may especially be implemented in a chip testing equipment for measuring timing critical nets in order to determine the delay contribution of the I/O cells with respect to the overall delay.

The above described peak current measurement technique may also be automated in an ASIC design flow to enable the measurements of delays of I/O cells.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Electronic device, comprising:
   at least one input/output circuit in a first supply voltage domain;
   a buffer, coupled to the input/output circuit for driving an input of the input/output circuit, having a first and second switch, wherein the buffer is arranged in a second supply voltage domain;

a control circuit, coupled to the buffer for controlling the first and second switch of the buffer such that during a transition of an input signal of the input/output circuit both switches are temporarily kept in a conducting state and a crowbar current flows through the buffer; and a first measuring circuit coupled to the buffer for measuring the current in the second supply voltage domain to determine the crowbar current flowing through the buffer.

2. Electronic device according to claim 1, wherein the buffer comprises a first and second resistor for controlling and for linearizing the current flowing through the buffer.

3. Electronic device according to claim 1, wherein a capacitance is coupled to the output of the buffer for determining an input slew of an input signal applied to the input/output circuit.

4. Electronic device according to claim 1, further comprising:

a second measuring circuit coupled to the output of the input/output circuit for measuring output signals of the input/output circuit, wherein the input/output delay of the input/output circuit is evaluated according to the measurements of the first and second measuring circuit.

5. Method for evaluating a delay of an input/output circuit within an electronic device, wherein the input/output circuit is arranged in a first supply voltage domain, comprising the steps of:

driving an input of the input/output circuit by a buffer coupled to the input/output circuit having a first and second switch, wherein the buffer is arranged in a second supply voltage domain, controlling the first and second switch such that during a transition of an input signal of the input/output circuit both switches are temporarily kept in a conducting state and a crowbar current flows through the buffer; and measuring the current in the second supply voltage domain to determine crowbar current flowing through the buffer.

* * * * *